United States Patent
Marshall

(10) Patent No.: US 8,304,263 B2
(45) Date of Patent: Nov. 6, 2012

(54) TEST CIRCUIT ALLOWING PRECISION ANALYSIS OF DELTA PERFORMANCE DEGRADATION BETWEEN TWO LOGIC CHAINS

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 593 days.

(21) Appl. No.: 12/550,918

(22) Filed: Aug. 31, 2009

(65) Prior Publication Data

US 2011/0050247 A1    Mar. 3, 2011

(51) Int. Cl.
*G01R 31/26* (2006.01)
*G01R 31/02* (2006.01)

(52) U.S. Cl. .................. 438/14; 324/762.01
(58) Field of Classification Search .......... None
See application file for complete search history.

(56) References Cited

U.S. PATENT DOCUMENTS

| | | | |
|---|---|---|---|
| 5,837,587 A * | 11/1998 | Wei | 438/305 |
| 6,664,798 B2 * | 12/2003 | De Jong et al. | 324/750.3 |
| 2001/0015653 A1 * | 8/2001 | De Jong et al. | 324/763 |
| 2010/0297793 A1 * | 11/2010 | Kulkarni et al. | 438/18 |
| 2011/0074385 A1 * | 3/2011 | Sunaga et al. | 324/76.11 |
| 2011/0298551 A1 * | 12/2011 | Yen et al. | 438/379 |

* cited by examiner

*Primary Examiner* — Jermele M Hollington
(74) *Attorney, Agent, or Firm* — Warren L. Franz; Wade J. Brady, III; Frederick J. Telecky, Jr.

(57) ABSTRACT

A test circuit for measuring a gate delay as a function of stress is disclosed. The test circuit includes an oscillator, a reference gate chain, a test gate chain, and a counter. The counter measures the difference in propagation delay between the test chain and the reference chain in calibrated oscillator cycles. Differences in test gate delay as a function of applied stress may be measured within the calibration accuracy of the oscillator frequency. The use of the reference gate chain allows a simpler unipolar counter.

11 Claims, 3 Drawing Sheets

TEST CIRCUIT ALLOWING PRECISION ANALYSIS OF DELTA PERFORMANCE DEGRADATION BETWEEN TWO LOGIC CHAINS

FIELD OF THE INVENTION

This invention relates to the field of integrated circuits. More particularly, this invention relates to test circuits in integrated circuits.

BACKGROUND OF THE INVENTION

Integrated circuits often include signal paths with components which delay signal propagation. The amount of signal delay is often a function of stress on the components. It is desirable to measure the signal delay as a function of stress.

SUMMARY OF THE INVENTION

This Summary is provided to comply with 37 C.F.R. §1.73, suggesting a summary of the invention briefly indicating the nature and substance of the invention. It is submitted with the understanding that it will not be used to interpret or limit the scope or meaning of the claims.

The instant invention provides a test circuit for measuring an average gate delay of a chain of test gates in the test circuit, which may be applied to measuring a differential gate delay as a function of stress applied to the test gates. The test circuit includes an oscillator, a reference gate chain, a test gate chain, and a counter. The counter measures the difference in propagation delay between the test chain and the reference chain in number of oscillator cycles.

A calibration divider circuit is included in the test circuit which divides the output pulse stream from the oscillator to provide a lower frequency pulse stream to facilitate frequency measurement by external test instruments.

A starter divider circuit is included in the test circuit which divides the output pulse stream from the oscillator to provide a repetitive starting pulse stream for the reference gate chain and test gate chain.

An optional start/stop decoder circuit may be included in the test circuit to start and stop the counter based on output signals from the test chain and the reference chain.

During operation of the test circuit, the oscillator cycle time is computed by measuring the outputs of the calibration divider circuit. A propagation delay between the test chain and the reference chain is measured in number of oscillator clock cycles. A test gate delay time may be estimated from the propagation delay and the oscillator cycle time. A stress level on the test chain may be adjusted and a second test gate delay time may be estimated using a second propagation delay measurement. The difference in test gate delay times as a function of stress may be computed.

An advantage of the instant invention is the difference in test gate delay times may be measured to an accuracy approximately equal to the accuracy of computing the oscillator cycle time.

DETAILED DESCRIPTION

Figure 1:
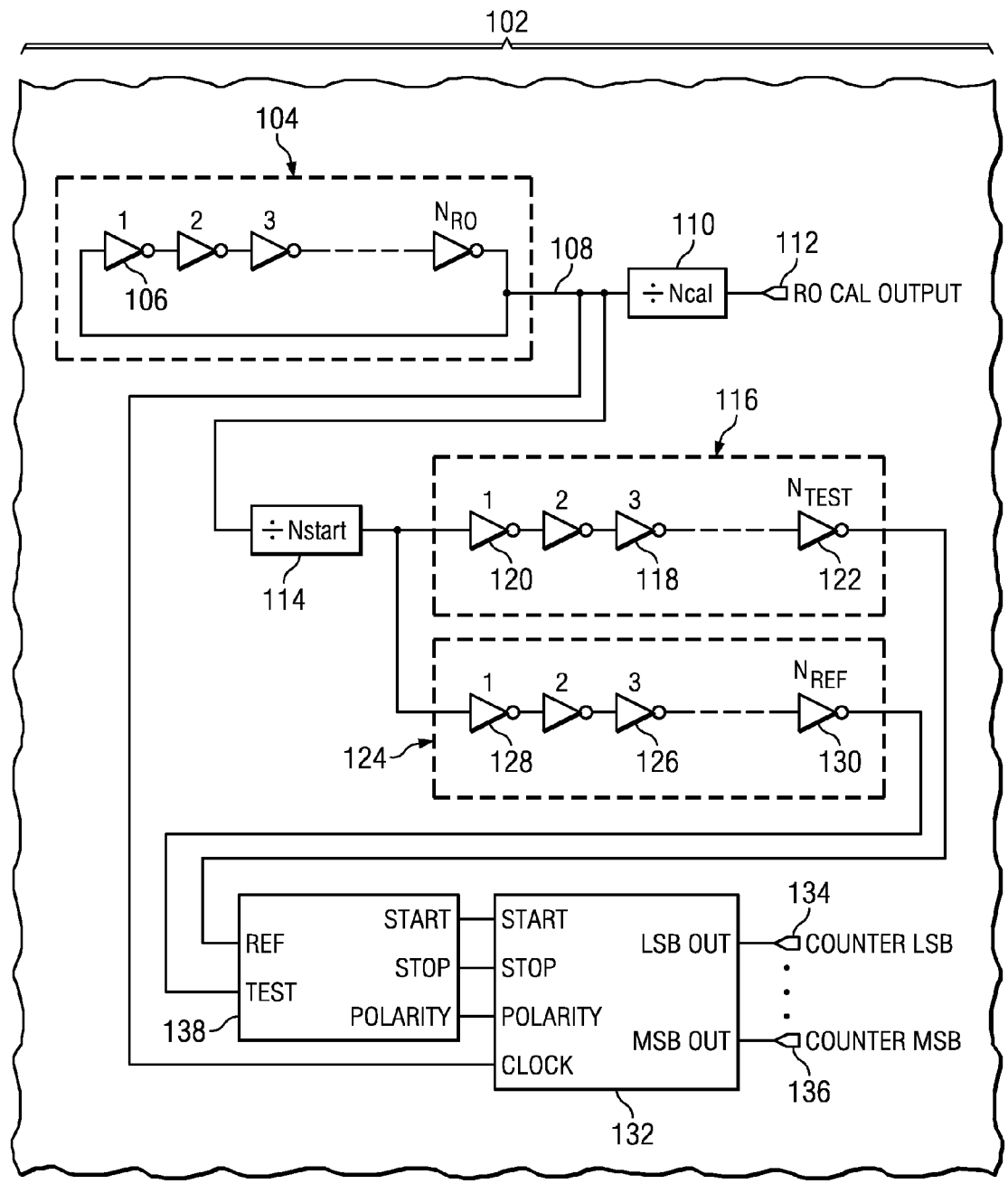
FIG. 1 is a schematic of an IC containing a test circuit formed according to an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "gate" is understood to mean a set of interconnected components, for example an inverter, which propagate a signal. A time interval known as a gate delay is associated with time to propagate the signal through the gate.

The instant invention provides a test circuit in an integrated circuit (IC); the test circuit includes an oscillator, a reference gate chain, a test gate chain, and a counter. The counter measures the difference in propagation delay between the test chain and the reference chain in number of oscillator cycles. The test circuit also includes a calibration divider circuit which divides the output pulse stream from the oscillator to provide a lower frequency pulse stream to facilitate frequency measurement, for example by external test instruments such as a frequency counter. The test circuit further includes a starter divider circuit which divides the output pulse stream from the oscillator to provide repetitive starting pulses for the reference gate chain and test gate chain.

The test circuit may also include an optional start/stop decoder circuit to start and stop the counter based on output signals from the test chain and the reference chain.

FIG. 1 is a schematic of an IC containing a test circuit formed according to an embodiment of the instant invention. The IC (100) contains at least one instance of the test circuit (102). The test circuit (102) includes an oscillator (104) which is preferably a ring oscillator as depicted in FIG. 1, but may possibly be a digitally controlled oscillator, an LC oscillator, or other type of oscillator. In a preferred embodiment, the ring oscillator includes a number, $N_{RO}$, of ring oscillator gates (106), depicted in FIG. 1 as inverters. In a preferred embodiment, the ring oscillator (104) includes 9 or 11 inverters, wherein each inverter includes p-channel metal oxide semiconductor (PMOS) transistor and an n-channel metal oxide semiconductor (NMOS) transistor connected drain to drain, an input to the inverter is connected in parallel to gates of the PMOS and NMOS transistors, and the connected drain nodes of the PMOS and NMOS transistors are connected to an output node of the inverter. The oscillator provides a continuous stable pulse stream of substantially uniform frequency on an oscillator output node (108). In a preferred embodiment, the oscillator (104) provides a pulse stream with a frequency above 1 GHz, that is above $1\times10^9$ Hz. A complete cycle of an output pulse from the oscillator is known as an oscillator clock cycle, because the output pulse stream from the oscillator provides a time base for the test circuit (102). A time interval to complete an oscillator clock cycle is known as an oscillator clock period. In a preferred embodiment in which the oscillator is an ring oscillator, the oscillator clock period is substantially equal to twice a sum of gate delays of all the ring oscillator gates (106).

The test circuit (102) includes a calibration divider circuit (110) which divides an input pulse stream on an input node by a frequency reduction factor greater than 1 to provide an output pulse stream on an output node with a lower frequency than the input pulse stream. The input node of the calibration divider circuit (110) is connected to the oscillator output node (108). The output node of the calibration divider circuit (110) is connected to an oscillator calibration connection (112), which may be a probe pad formed at a top surface of the IC (100), or other component which enables measurement of the output frequency of the calibration divider circuit (110), for example by a test instrument such as a frequency counter external to the IC (100). In a preferred embodiment, the calibration divider circuit (110) reduces the oscillator output frequency by a frequency reduction factor equal to an integral power of 2 from 512 to 4096.

The test circuit (102) includes a starter divider circuit (114) which has an input node connected to the oscillator output node (108) and an output node. The starter divider circuit (114) functions similarly to the calibration divider circuit (110), with the exception that a frequency reduction factor of the starter divider circuit (114) is possibly different from the frequency reduction factor of the calibration divider circuit (110). In a preferred embodiment, the starter divider circuit (110) reduces the oscillator output frequency by a factor of an integral power of 2 from 1024 to 4096 at the output node.

The test circuit (102) further includes a test gate chain (116) containing a number, $N_{TEST}$, of test gates (118) connected in series. Each test gate (118) propagates a signal on an input node of the test gate (118) to an output node of the test gate (118) during a test gate delay time. An input node of the first test gate (120) is connected to the output node of the starter divider circuit (110). A signal applied to an input node of the first test gate (120) will propagate through the test gates (118) to the last test gate (122) and generate a signal on an output node of the last test gate (122).

The test circuit (102) also includes a reference gate chain (124) containing a number, $N_{REF}$, of reference gates (126) connected in series. Each reference gate (126) propagates a signal on an input node of the reference gate (126) to an output node of the reference gate (126) during a reference gate delay time. An input node of the first reference gate (128) is connected to the output node of the starter divider circuit (110). A signal applied to an input node of the first reference gate (128) will propagate through the reference gates (126) to the last reference gate (130) and generate a signal on an output node of the last reference gate (130).

In a preferred embodiment in which the oscillator is an ring oscillator, the reference gates (126) may be substantially the same as the ring oscillator gates (106) so that a reference gate delay of each reference gate (126) is substantially equal to an ring oscillator gate delay of each ring oscillator gate (106).

In another embodiment, the test gates (118) may be substantially the same as the reference gates (126) so that a propagation delay of each test gate (118) is substantially equal to a propagation delay of each reference gate (126) when the test chain (116) is operated under substantially identical conditions, such as bias voltage, as the reference chain (124).

In one embodiment, the number $N_{TEST}$ of test gates (118) in the test gate chain (116) is equal to the number $N_{REF}$ of reference gates (126) in the reference gate chain The test circuit (102) also includes a counter circuit (132) which has a start input, a stop input, a clock input and an optional polarity input. The counter circuit (132) counts a number oscillator pulses on the clock input between a start signal on the start input and a stop signal on the stop input. The counter circuit (132) also has one or more count outputs which provide a set of bits signifying the number of clock pulse counted. In a preferred embodiment, the outputs include binary bit lines from a least significant bit (LSB) line, connected to an LSB output node (134), to a most significant bit (MSB) line, connected to an MSB output node (136). If the optional polarity input is present, the outputs preferably include information from the polarity input, for example by designating one output as a polarity bit output.

The output node of the test gate chain (116) and the output node of the reference gate chain (124) are connected to the start input and stop input of the counter circuit (132) through a start/stop decoder circuit (138), which has a test input and a reference input, and a start output, a stop output and an optional polarity output. The test input is connected to the output node of the last test gate (122). The reference input is connected to the output node of the last reference gate (130). The start output is connected to the start input of the counter circuit (132), and the stop output is connected to the stop input of the counter circuit (132). The optional polarity output, if present, is connected to the optional polarity input, if present, of the counter circuit (132).

In one embodiment of the test circuit (102) in which the signal at the output node of the last reference gate (130) is known to occur before the signal at the output node of the last test gate (122), the reference input may be directly connected to the start output, and the test input may be directly connected to the stop output, and the optional polarity output may be dispensed with.

In a preferred embodiment of the test circuit (102), a signal is provided at the start output when a signal is received at the reference input or the test input, and a signal is provided at the stop output when signals have been received at both the reference input and the test input, and one of two signals is provided at the polarity output depending on whether the signal from the test gate chain or the reference gate chain is received first. A first signal, for example a high voltage state, may be provided at the polarity output if the signal at the reference input was received before the signal at the test input was received, while a second signal, for example a low voltage state, may be provided at the polarity output if the signal at the test input was received before the signal at the reference input was received.

Figure 2:
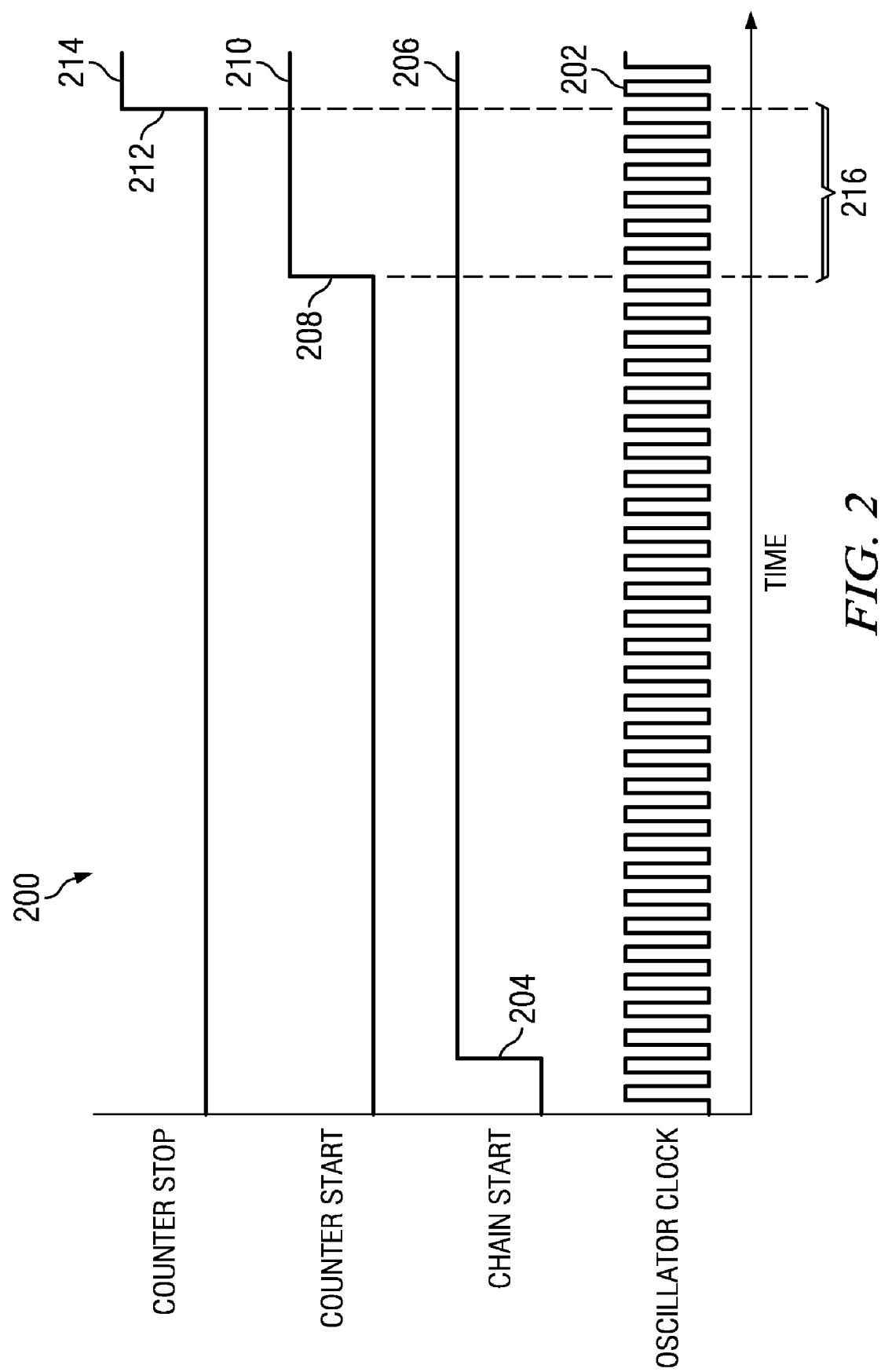
FIG. 2 is a timing chart depicting signals occurring during operation of the test circuit described in reference to FIG. 1.

FIG. 2 is a timing chart depicting signals occurring during operation of the test circuit described in reference to FIG. 1. The oscillator runs continuously, providing a pulse stream on the oscillator output node, as depicted by oscillator clock waveform (202). The oscillator pulse stream is applied to the input of the starter divider circuit and the clock input of the counter circuit. The oscillator pulse stream is divided by the starter divider circuit, which outputs a chain start signal, depicted by a rising edge (204) in chain start waveform (206). The chain start signal is applied to input nodes of the reference gate chain and the test gate chain, and propagates through the reference gate chain and the test gate chain. When the chain start signal emerges from the first of either the reference gate chain or the test gate chain, the start/stop decoder circuit provides a counter start signal, depicted as a rising edge (208) in counter start waveform (210), to the start input of the counter circuit. When the chain start signal emerges from the second of either the reference gate chain or the test gate chain, the start/stop decoder circuit provides a counter stop signal, depicted as a rising edge (212) in counter stop waveform (214), to the stop input of the counter circuit. If the optional polarity output of the start/stop decoder circuit is present, a polarity signal may be provided to the optional polarity input of the counter circuit, if present. The counter circuit outputs signals which indicate the number of oscillator pulses (216) between the counter start signal and the counter stop signal.

Figure 3:
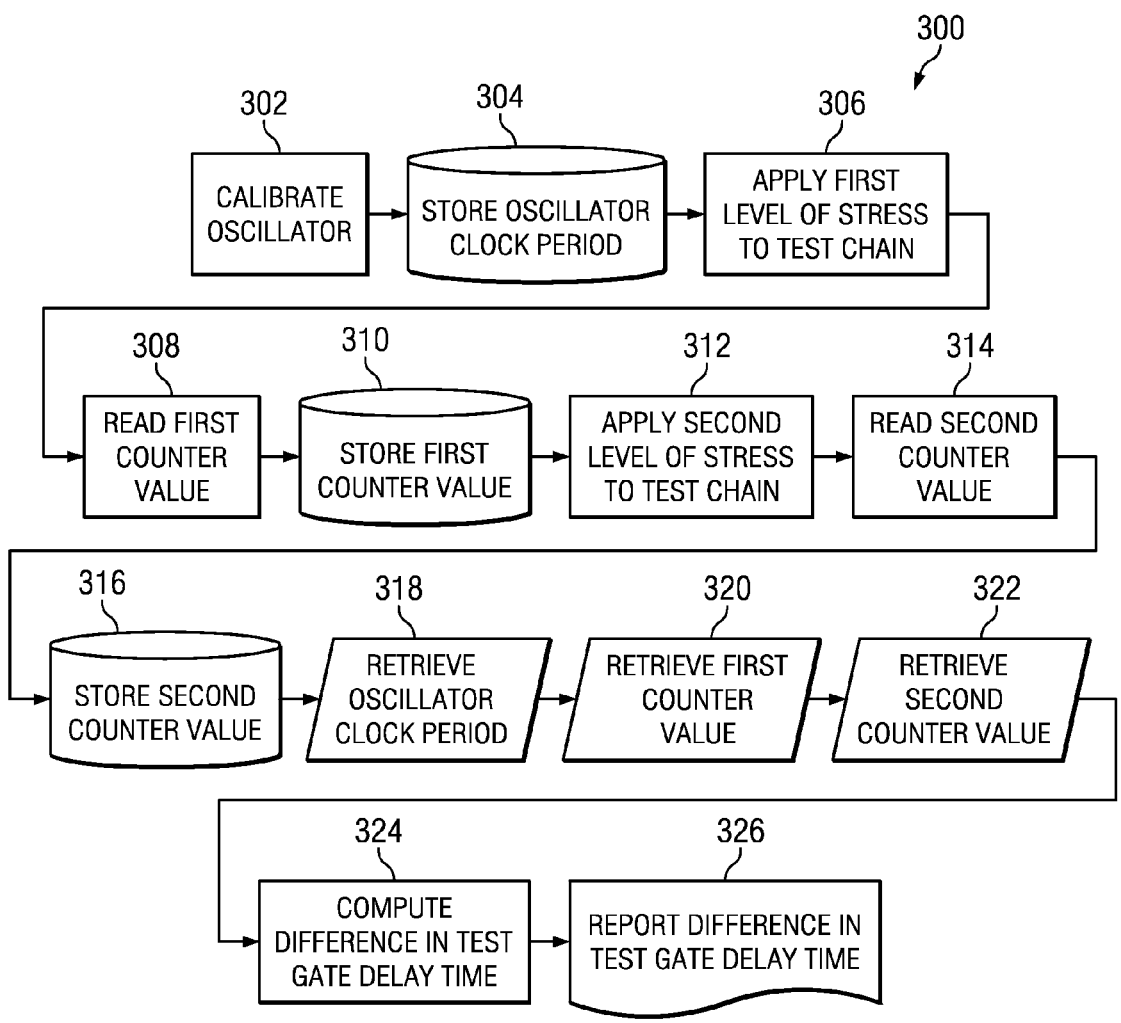
FIG. 3 is a flowchart depicting a mode of operation of the test circuit described in reference to FIG. 1.

A mode of operation of the test circuit described in reference to FIG. 1 is depicted by a test measurement flowchart shown in FIG. 3. The test measurement flowchart (300) starts with a calibration of the oscillator, as depicted by step (302). The oscillator calibration connection is connected to a frequency measurement apparatus, for example by contacting the oscillator calibration connection with a test probe. The output pulse stream from the calibration divider circuit is by the frequency measurement apparatus to determine the frequency of pulses from the calibration divider circuit. The oscillator clock period is computed from the measured frequency of pulses from the calibration divider circuit and the frequency reduction factor of the calibration divider circuit using the following expression:

$$T_{oscillator} = \frac{1}{F_{calibration\ divider} \times R_{frequency\ reduction}} \qquad \text{Eqn. 1}$$

where:

$T_{oscillator}$ is the oscillator clock period, $F_{calibration\ divider}$ is the frequency from the calibration divider circuit, and $R_{frequency\ reduction}$ is the frequency reduction factor of the calibration divider circuit.

The value of the oscillator clock period is stored for future recall, as depicted by step (304).

Operation of the test circuit continues with application of a first level of stress to the test gates in the test gate chain, as depicted by step (306). A first value $N_{first}$ of the counter circuit is read from the counter output nodes, as depicted by step (308). The first counter output is stored for future recall, as depicted by step (310). A second level of stress is applied to the test gates, as depicted by step (312). A second value $N_{second}$ of the counter circuit is read from the counter output nodes, as depicted by step (314). The second counter output is stored for future recall, as depicted by step (316).

The oscillator clock period, the first value $N_{first}$ and the second value $N_{second}$ are recalled as depicted by step (318), step (320) and step (322), respectively. A difference in test gate delay time due to a difference in the first level of stress and the second level of stress is computed by the following expression, as depicted by step (324):

$$\Delta T_{test\ gate\ delay} = \frac{(N_{second} - N_{first}) \times T_{oscillator}}{N_{TEST}}. \qquad \text{Eqn 2}$$

where:

$\Delta T_{test\ gate\ delay}$ is the difference in test gate delay time, $N_{first}$ is the number of oscillator pulses between the counter start signal and the counter stop signal during application of the first level of stress, $N_{second}$ is the number of oscillator pulses between the counter start signal and the counter stop signal during application of the second level of stress, and $N_{TEST}$ is the number of test gates in the test chain.

The value of the difference in test gate delay time is reported, as depicted by step (326).

Figure 4:
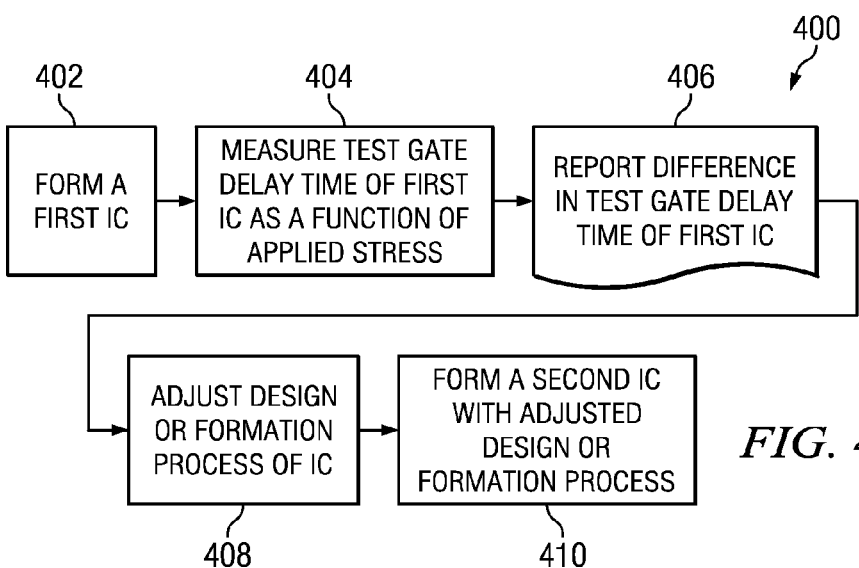
FIG. 4 is a flowchart depicting a method of forming an IC using the inventive test circuit.

FIG. 4 is a flowchart depicting a method (400) of forming an IC using the inventive test circuit. A first IC is formed which contains one or more instances of the test circuit, as depicted by step (402). One or more differences in test gate delay time as a function of stress is measured in one or more instances of the test circuit in the first IC, as depicted by step (404), and reported as depicted by step (406). The reported values of the differences in test gate delay time as a function of stress are used to adjust a design or a formation process of the IC, as depicted by step (408). A second IC is formed using the adjusted design or formation process, as depicted by step (410).

What is claimed is:

1. A process of forming an integrated circuit, comprising the steps of:

forming a test circuit by a process further including the steps:

forming an oscillator having an oscillator output node;

forming a calibration divider circuit having a calibration divider input node and a calibration divider output node, such that said calibration divider input node is connected to said oscillator output node;

forming a starter divider circuit having a starter divider input node and a starter divider output node, such that said starter divider input node is connected to said oscillator output node;

forming a test gate chain containing a number, $N_{TEST}$, of test gates, wherein said test gates are connected in series between a test gate chain input node and a test gate chain output node, and wherein said test gate chain input node is connected to said starter divider output node;

forming a reference gate chain containing a number, $N_{REF}$, of reference gates, wherein said reference gates are connected in series between a reference gate chain input node and a reference gate chain output node, and wherein said reference gate chain input node is connected to said starter divider output node;

forming a start/stop decoder circuit including a test input, a reference input, a start output and a stop output, wherein said test input is connected to said test gate chain output, wherein said reference input is connected to said reference gate chain output; and forming a counter circuit including a start input, a stop input, a clock input and a plurality of count outputs, wherein said start input is connected to said start output of said start/stop decoder circuit, said stop input is connected to said stop output of said start/stop decoder circuit, said clock input is connected to said oscillator output node;

measuring a change in a gate delay time due to an applied stress, by a process further including the steps:

calibrating an oscillator;

measuring a first test gate chain delay time;

measuring a second test gate chain delay time; and determining said change in a gate delay time.

2. The process of claim 1, wherein:
said oscillator provides a continuous oscillator pulse stream of substantially uniform frequency on said oscillator output node;
said calibration divider circuit provides a continuous calibration pulse stream on said calibration divider output node such that a frequency of said calibration pulse stream at said calibration divider output node is equal to said frequency of said oscillator pulse stream at said oscillator output node divided by a calibration frequency reduction factor, said frequency reduction factor being greater than 1;
said starter divider circuit provides a continuous stream of chain start signals on said starter divider output node such that a frequency of said stream of chain start signals at said starter divider output node is equal to said frequency of said oscillator pulse stream at said oscillator output node divided by a starter frequency reduction factor, said frequency reduction factor being greater than 1;
a signal at said test gate input node is propagated through said test gates to said test gate output node to provide a test chain signal at the test gate chain output node during a test gate delay time;
a signal at said reference gate input node is propagated through said reference gate to said reference gate output node to provide a reference gate chain signal at the reference gate chain output node during a reference gate delay time;
said start/stop decoder circuit provides a signal at said start output when a signal is received at either said test input or said reference input, and provides a signal at said stop output when signals have been received at both said test input and said reference input; and
said counter circuit provides count signals at said count outputs which indicate a number of pulses received at said clock input between said signal at said start input and said signal at said stop input.

3. The process of claim 2, in which said step of calibrating said oscillator further includes the steps of:
measuring a frequency of pulses from a calibration divider circuit which reduces a frequency of pulses from an oscillator output node of said oscillator by a calibration frequency reduction factor; and
computing a clock period of said oscillator using the expression:

$$T_{oscillator} = \frac{1}{F_{calibration\ divider} \times R_{frequency\ reduction}}$$

where:
$T_{oscillator}$ is the oscillator clock period,
$F_{calibration\ divider}$ is the frequency from the calibration divider circuit, and
$R_{frequency\ reduction}$ is the frequency reduction factor of the calibration divider circuit.

4. The process of claim 3, in which said step of measuring said first test gate chain delay time further includes the steps:
applying a chain start signal concurrently to a reference gate chain containing a number $N_{REF}$ reference gates connected in series and a test gate chain containing a number $N_{TEST}$ test gates connected in series;
providing a counter start signal at a start output of a start/stop decoder circuit when a first of said reference chain signal or said test chain signal is received at said start/stop decoder circuit, wherein said output node of said reference gate chain is connected to a reference input of said start/stop decoder circuit, and wherein said output node of said test gate chain is connected to a test input of said start/stop decoder circuit;
providing a counter stop signal at a stop output of said start/stop decoder circuit when a second of said reference chain signal or said test chain signal is received at said start/stop decoder circuit; and
counting a first number $N_{first}$ of oscillator pulses at a clock input of a counter circuit, wherein said clock input is connected to said oscillator output node, between receiving said counter start signal at a start input of said counter circuit, wherein said start input is connected to said start output of said start/stop decoder circuit, and receiving said counter stop signal at a stop input of said counter circuit, wherein said stop input is connected to said stop output of said start/stop decoder circuit.

5. The process of claim 4, in which said step of measuring said second test gate chain delay time further includes the steps of:
applying a second chain start signal concurrently to said reference gate chain and said test gate chain;
providing a second counter start signal at said start output of said start/stop decoder circuit when a first of said second reference chain signal or said second test chain signal is received at said start/stop decoder circuit;
providing a second counter stop signal at said stop output of said start/stop decoder circuit when a second of said second reference chain signal or said second test chain signal is received at said start/stop decoder circuit; and
counting a second number $N_{second}$ of oscillator pulses at said clock input of a counter circuit, between receiving said second counter start signal at said start input of said counter circuit, and receiving said second counter stop signal at said stop input of said counter circuit.

6. The process of claim 5, in which said step of determining said change in said gate delay time further includes the step of using the expression:

$$\Delta T_{test\ gate\ delay} = \frac{(N_{second} - N_{first}) \times T_{oscillator}}{N_{TEST}}$$

where:
$\Delta T_{test\ gate\ delay}$ is the difference in test gate delay time.

7. The process of claim 6, in which:
said oscillator is a ring oscillator further including ring oscillator gates; and
said reference gates are substantially identical to said ring oscillator gates.

8. The process of claim 7, in which said test gates are substantially identical to said reference gates.

9. The process of claim 6, in which said number of reference gates, $N_{REF}$, is between 1 percent and 3 percent less than said number of test gates, $N_{TEST}$.

10. The process of claim 6, in which said number of reference gates, $N_{REF}$, is equal to said number of test gates, $N_{TEST}$.

11. The process of claim 6, further comprising the steps of;
providing a first polarity signal from a polarity output of said start/stop decoder circuit to a polarity input of said counter circuit if said reference chain signal is received at said reference input of said start/stop decoder circuit before said test chain signal is received at said test input of said start/stop decoder circuit; and providing a second polarity signal from said polarity output of said start/stop decoder circuit to said polarity input of said counter circuit if said reference chain signal is received at said reference input of said start/stop decoder circuit after said test chain signal is received at said test input of said start/stop decoder circuit.

* * * * *